United States Patent
Lin et al.

(10) Patent No.: US 8,436,411 B2
(45) Date of Patent: May 7, 2013

(54) NON-VOLATILE MEMORY

(75) Inventors: Sung-Bin Lin, Hsinchu (TW);
Yuan-Hsiang Chang, Hsinchu (TW);
Yu-Huang Yeh, Hsinchu (TW);
Che-Lieh Lin, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 339 days.

(21) Appl. No.: 12/349,275

(22) Filed: Jan. 6, 2009

(65) Prior Publication Data
US 2010/0171165 A1 Jul. 8, 2010

(51) Int. Cl.
*H01L 29/788* (2006.01)

(52) U.S. Cl.
USPC ........... 257/316; 257/315; 257/319; 257/320; 257/326

(58) Field of Classification Search ................ 257/298, 257/314–326
See application file for complete search history.

(56) References Cited

U.S. PATENT DOCUMENTS

| | | | | |
|---|---|---|---|---|
| 4,961,002 A | | 10/1990 | Tam et al. | |
| 5,055,897 A | * | 10/1991 | Canepa et al. | 257/319 |
| 5,063,431 A | * | 11/1991 | Ohshima | 257/316 |
| 5,300,802 A | * | 4/1994 | Komori et al. | 365/185.33 |
| 5,621,336 A | * | 4/1997 | Shibata et al. | 326/36 |
| 5,719,520 A | * | 2/1998 | Au et al. | 327/427 |
| 5,889,305 A | * | 3/1999 | Choi et al. | 257/324 |
| 5,892,258 A | * | 4/1999 | Kobatake | 257/316 |
| 6,291,855 B1 | * | 9/2001 | Chang et al. | 257/316 |
| 7,388,250 B2 | | 6/2008 | Chen et al. | |

* cited by examiner

*Primary Examiner* — Ori Nadav
(74) *Attorney, Agent, or Firm* — WPAT, PC; Justin King

(57) ABSTRACT

A non-volatile memory including a substrate, two first conductive layers, a second conductive layer, a first dielectric layer, a second dielectric layer and two heavily doped regions is provided. The substrate has at least two isolation structures therein and an active region between the isolation structures. The first conductive layers are respectively disposed on the isolation structures. The second conductive layer is disposed on the substrate and covering a portion of the active region and a portion of each first conductive layer. The first dielectric layer is disposed between each first conductive layer and the second conductive layer. The second dielectric layer is disposed between the second conductive layer in the active region and the substrate. The heavily doped regions are disposed in the substrate beside the second conductive layer in the active region.

16 Claims, 6 Drawing Sheets

NON-VOLATILE MEMORY

BACKGROUND OF THE INVENTION

1. Field of Invention

The present invention relates to a semiconductor device, and more generally to a non-volatile memory.

2. Description of Related Art

A non-volatile memory provides the property of multiple entries, retrievals and erasures of data, and is able to retain the stored information even when the electrical power is off. As a result, non-volatile memory is widely used in personal computers and consumer electronic products.

A conventional non-volatile memory uses an N-type well as a control gate. The control gate of such a non-volatile memory is not a conductive layer stacked on the floating gate but an N-type well disposed in the substrate, so that the steps of depositing the conductive layer and defining the control gate are not required, and only a single polysilicon layer serving as a floating gate is necessary. In such a single-poly non-volatile memory, the programming and erasing operations thereof are performed by respectively injecting channel hot holes (CHEs) and channel hot holes (CHHs). However, the said programming and erasing operations with CHEs and CHHs consume more electrical power and have a narrower operation window.

Further, the N-type well serving as a control gate has to be formed in the substrate, so that the design rule of the single-poly non-volatile memory is different from that of a common double-poly non-volatile memory. For example, in order to form the N-type well serving as a control gate in the substrate, the process for forming the N-type well has to be integrated with a logic circuit fabrication process. That is, the fabrication process of such a non-volatile memory may be integrated with a CMOS transistor process. However, this integration may cause a complicated design in the peripheral circuit of such a non-volatile memory, and the application thereof is seriously limited.

SUMMARY OF THE INVENTION

Accordingly, the present invention provides a non-volatile memory to solve the above-mentioned problems and enhance the operation flexibility and application of the device.

The present invention provides a non-volatile memory including a substrate, two first conductive layers, a second conductive layer, a first dielectric layer, a second dielectric layer and two heavily doped regions. The substrate has at least two isolation structures therein and an active region between the isolation structures. The first conductive layers are respectively disposed on the isolation structures. The second conductive layer is disposed on the substrate and covering a portion of the active region and a portion of each first conductive layer. The first dielectric layer is disposed between each first conductive layer and the second conductive layer. The second dielectric layer is disposed between the second conductive layer in the active region and the substrate. The heavily doped regions are disposed in the substrate beside the second conductive layer in the active region.

According to an embodiment of the present invention, each first conductive layer includes polysilicon, doped polysilicon, work function metal or combinations thereof, for example.

According to an embodiment of the present invention, the second conductive layer includes polysilicon, doped polysilicon, work function metal or combinations thereof, for example.

According to an embodiment of the present invention, the first dielectric layer includes oxide, nitride, carbide, high k metal oxide or combinations thereof, for example.

According to an embodiment of the present invention, the second dielectric layer includes oxide, nitride, metal oxide or combinations thereof, for example.

According to an embodiment of the present invention, the non-volatile memory further includes a well disposed in the substrate.

According to an embodiment of the present invention, the non-volatile memory further includes two lightly doped regions. The two lightly doped regions are respectively disposed in the substrate between the second conductive layer in the active region and each heavily doped region.

According to an embodiment of the present invention, the non-volatile memory further includes a spacer disposed on a sidewall of the second conductive layer in the active region.

According to an embodiment of the present invention, an overlapped area between one of the first conductive layers and the second conductive layer is the same as an overlapped area between the other of the first conductive layers and the second conductive layer.

According to an embodiment of the present invention, each first conductive layer is a control gate, the second conductive layer is a floating gate, the first dielectric layer is a gate dielectric layer, and the second dielectric layer is a tunneling dielectric layer.

The non-volatile memory of the present invention has two control gates, so that the charge connection voltage ($V_{CC}$) is reduced and the operation flexibility is enhanced. Further, the design rule of the non-volatile memory of the present invention can be integrated with a common transistor fabrication process without a complicated peripheral circuit design, so that the application of the same is significantly enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
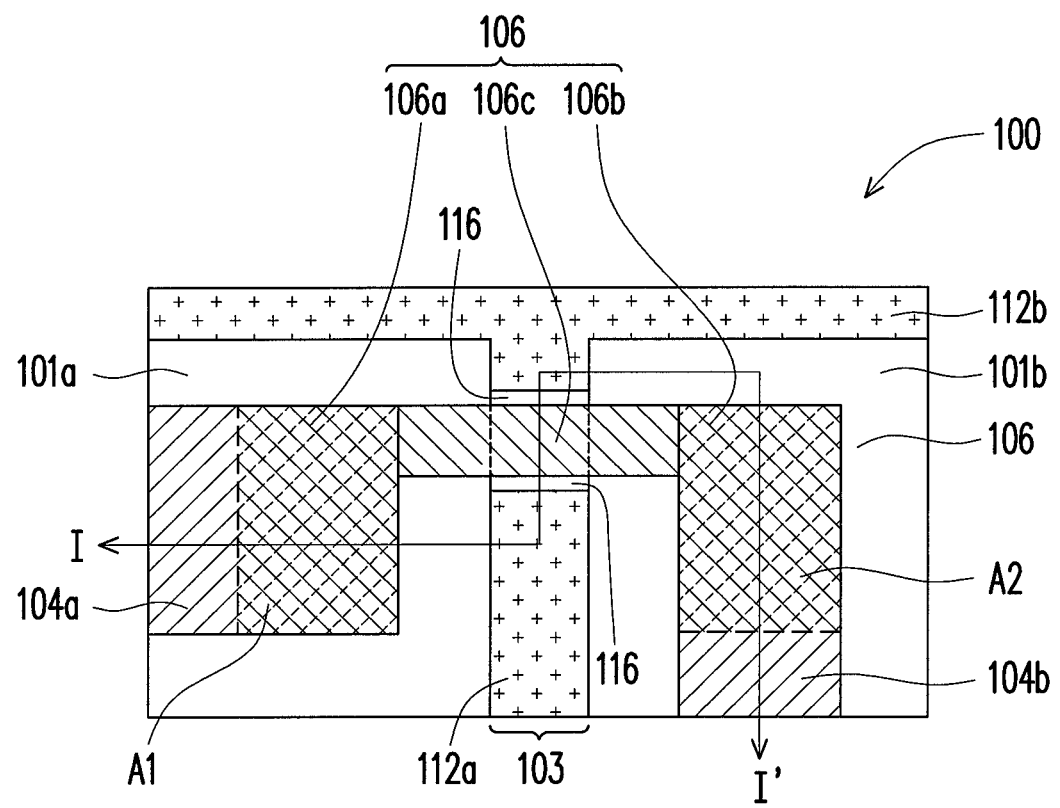
FIG. 1 schematically illustrates a top view of a non-volatile memory according to an embodiment of the present invention.
Figure 2:
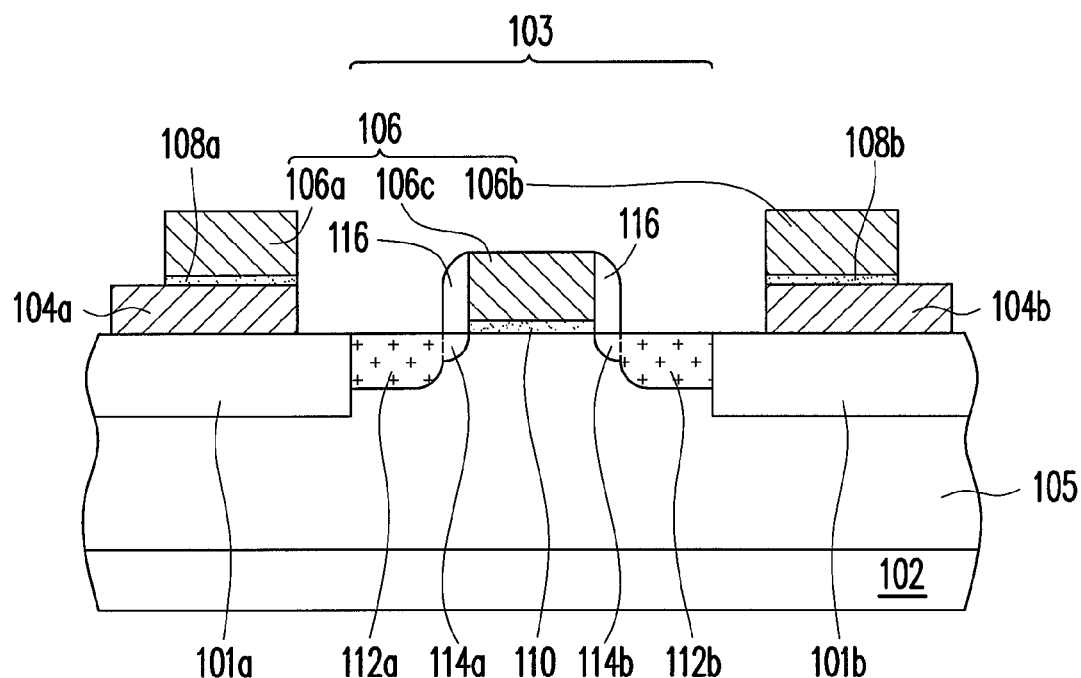
FIG. 2 schematically illustrates a cross-sectional view of the non-volatile memory taken along the line I-I' in FIG. 1.

FIG. 1 schematically illustrates a top view of a non-volatile memory according to an embodiment of the present invention. FIG. 2 schematically illustrates a cross-sectional view of the non-volatile memory taken along the line I-I' in FIG. 1.

Referring to FIG. 1 and FIG. 2, a non-volatile memory 100 includes a substrate 102, first conductive layers 104a and 104b, a second conductive layer 106, first dielectric layers 108a and 108b, a second dielectric layer 110 and heavily doped regions 112a and 112b.

The substrate 102 may be a semiconductor substrate such as a silicon substrate. The substrate 102 has at least two isolation structures 101a and 101b and an active region 103. The isolation structures 101a and 101b may be shallow trench isolation (STI) structures and respectively disposed in the substrate 102. The active region 103 is disposed between the isolation structures 101a and 101b.

The first conductive layers 104a and 104b are respectively disposed on the isolation structures 101a and 101b. The first conductive layers 104a and 104b include polysilicon, doped polysilicon, work function metal or combinations thereof, for example.

The second conductive layer 106 is disposed on the substrate 102. In an embodiment, the second conductive layer 106 is shaped as an inverted-U and can be divided into the second conductive layers 106a, 106b and 106c according to the positions thereof, as shown in FIG. 1. The second conductive layer 106c covers a portion of the active region 103. The second conductive layers 106a and 106c respectively cover a portion of the first conductive layers 104a and 104b. The second conductive layer 106 includes polysilicon, doped polysilicon, work function metal or combinations thereof, for example.

The first dielectric layer 108a is disposed between the first conductive layer 104a and the second conductive layer 106a. The first dielectric layer 108b is disposed between the first conductive layer 104b and the second conductive layer 106b. The material of the first dielectric layers 108a and 108b may be a dielectric material including oxide, nitride, carbide, high k metal oxide or combinations thereof, such as a composite material including silicon oxide and silicon nitride. In an embodiment, the first dielectric layers 108a and 108b may be silicon oxide-silicon nitride-silicon oxide (ONO) composite layers.

The second dielectric layer 110 is disposed between the second conductive layer 106c in the active region 103 and the substrate 102. The second dielectric layer 110 includes oxide, nitride, metal oxide or combinations thereof, for example.

The heavily doped region 112a and 112b are respectively disposed in the substrate 102 beside the second conductive layer 106c in the active region 103. In an embodiment, the heavily doped regions 112a and 112b are N-type heavily doped regions and include N-type dopant such as arsenic and phosphorus. In another embodiment, the heavily doped regions 112a and 112b are P-type heavily doped regions and include P-type dopant such as boron.

The non-volatile memory 100 of the present invention further includes a well 105, lightly doped regions 114a and 114b and a spacer 116. The well 105 is disposed in the substrate 102. In an embodiment, the well 105 is a P-type well and includes P-type dopant such as boron. In another embodiment, the well 105 is an N-type well and includes N-type dopant such as arsenic and phosphorus.

The lightly doped region 114a is disposed in the substrate 102 between the second conductive layer 106c in the active region 103 and the heavily doped region 112a. The lightly doped region 114b is disposed in the substrate 102 between the second conductive layer 106c in the active region 103 and the heavily doped region 112b. In an embodiment, when the well 105 is a P-type well, the lightly doped regions 114a and 114b are N-type lightly doped regions and include N-type dopant such as arsenic and phosphorus. In another embodiment, when the well 105 is an N-type well, the lightly doped regions 114a and 114b are P-type lightly doped regions and include P-type dopant such as boron.

The spacer 116 is disposed on the sidewall of the second conductive layer 106c in the active region 103. The spacer 116 includes oxide, nitride, oxynitride or combinations thereof, for example.

In the non-volatile memory 100 of the present invention, the first conductive layers 104a and 104b are control gates, the second conductive layer 106 (including 106a, 106b and 106c) is a floating gate, the first dielectric layers 108a and 108b are inter-gate dielectric layers, and the second dielectric layer 110 is a tunneling dielectric layer.

In an embodiment, the coupled areas of the first conductive layers 104a and 104b respectively with the second conductive layer 106 are the same, as shown in FIG. 1. In details, the overlapped area between the first conductive layer 104a and the second conductive layer 106a is A1, the overlapped area between the first conductive layer 104b and the second conductive layer 106b is A2, and A1 is equal to A2. In another embodiment (not shown), the coupled areas of the first conductive layers 104a and 104b respectively with the second conductive layer 106 are different upon the design requirement. It is appreciated by persons skilled in the art that the shapes of the first conductive layers 104a and 104b as well as the shape of the second conductive layer 106 are not limited by FIG. 1 and can be adjusted upon the design requirement.

Further, a single memory cell in FIG. 1 and FIG. 2 is provided for illustration purposes and is not construed as limiting the present invention. It is appreciated by persons skilled in the art that the non-volatile memory of the present invention can be arranged repeatedly to form a non-volatile memory array.

Figure 3:
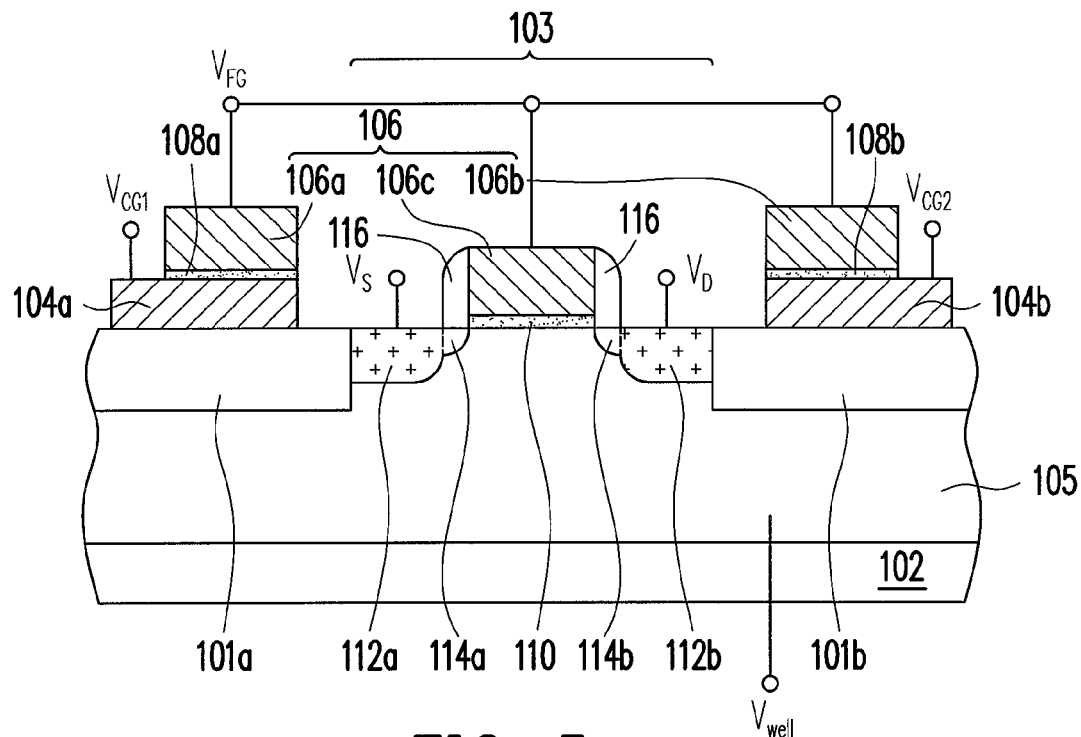
FIG. 3 schematically illustrates the programming, erasing and reading operations of the non-volatile memory of the present invention.

The non-volatile memory depicted in FIG. 2 is taken to illustrate the programming, erasing and reading operations of the non-volatile memory of the present invention. FIG. 3 schematically illustrates the programming, eraing and reading operations of the non-volatile memory of the present invention.

Referring to FIG. 3, when the programming operation is performed, a voltage $V_{CG1}$ is applied to the first conductive layer 104a, a voltage $V_{CG2}$ is applied to the first conductive layer 104b, and a voltage $V_{WELL}$ is applied to the well 105. The voltages $V_{CG1}$ and $V_{CG2}$ may be positive voltages enough for the programming operation, and the voltage $V_{WELL}$ is about 0 V. The second conductive layer 106 (including 106a, 106b and 106c) are connected to each other in the layout as shown in FIG. 1, so that the second conductive layers 106a, 106b and 106c are equal potential. When the control gate voltages are applied to the first conductive layers 104a and 104b, the voltages of the second conductive layers 106a, 106b and 106c are the same, and the said programming operation is performed through electron Fowler-Nordheim (FN) tunneling from the substrate 102 to the second conductive layer 106c.

When the erasing operation is performed, a voltage $V_{CG1}$ is applied to the first conductive layer 104a, a voltage $V_{CG2}$ is applied to the first conductive layer 104b, and a voltage $V_{WELL}$ is applied to the well 105. The voltages $V_{CG1}$ and $V_{CG2}$ are about 0 V, and the voltage $V_{WELL}$ may be a positive voltage enough for the erasing operation. The said erasing operation is performed through electron FN tunneling from the second conductive layer 106c to the substrate 102.

When the reading operation is performed, a voltage $V_{CG1}$ is applied to the first conductive layer 104a, a voltage $V_S$ is applied to the heavily doped region 112a, a voltage $V_D$ is applied to the heavily doped region 112b, and a voltage $V_{WELL}$ is applied to the well 105. The voltages $V_{CG1}$ and $V_D$ may be positive voltages enough for the reading operation, and the voltages $V_{WELL}$ and $V_S$ are about 0 V.

It is noted that the floating gate voltage $V_{FG}$ is coupled to the two control gate voltages $V_{CG1}$ and $V_{CG2}$ in the present invention, so that the voltages $V_{CG1}$ and $V_{CG2}$ can be reduced. In other words, since the non-volatile memory of the present invention has two control gates, for the same coupled voltage, the required charge connection voltage ($V_{CC}$) thereof can be much less than that of the conventional non-volatile memory with a single control gate; thus, less electrical power is consumed.

The method of fabricating the non-volatile memory of the present invention is described in the following. FIGS. 4A to 4D are top views illustrating a method of fabricating a non-volatile memory according to an embodiment of the present invention. FIGS. 5A to 5D are cross-sectional views illustrating a method of fabricating a non-volatile memory taken along the line I-I' in FIGS. 4A to 4D.

Figure 4A:
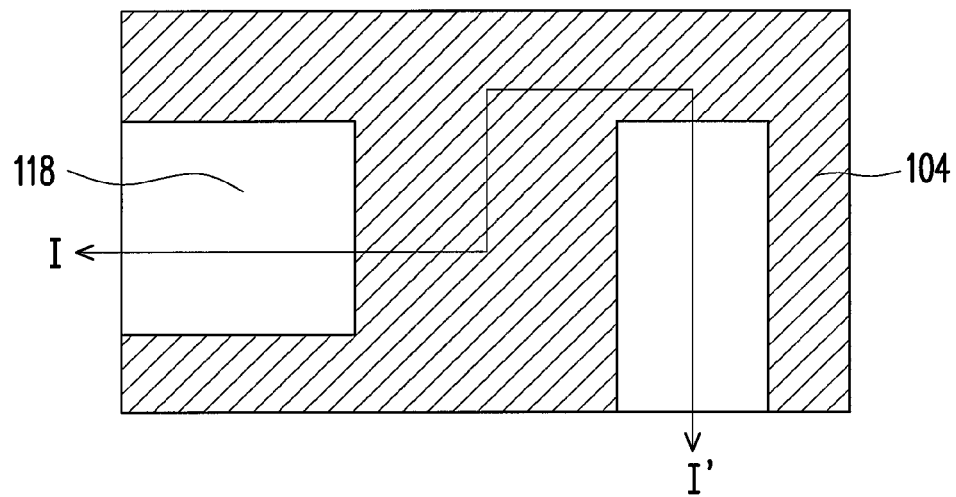
FIGS. 4A to 4D are top views illustrating a method of fabricating a non-volatile memory according to an embodiment of the present invention.
Figure 5A:
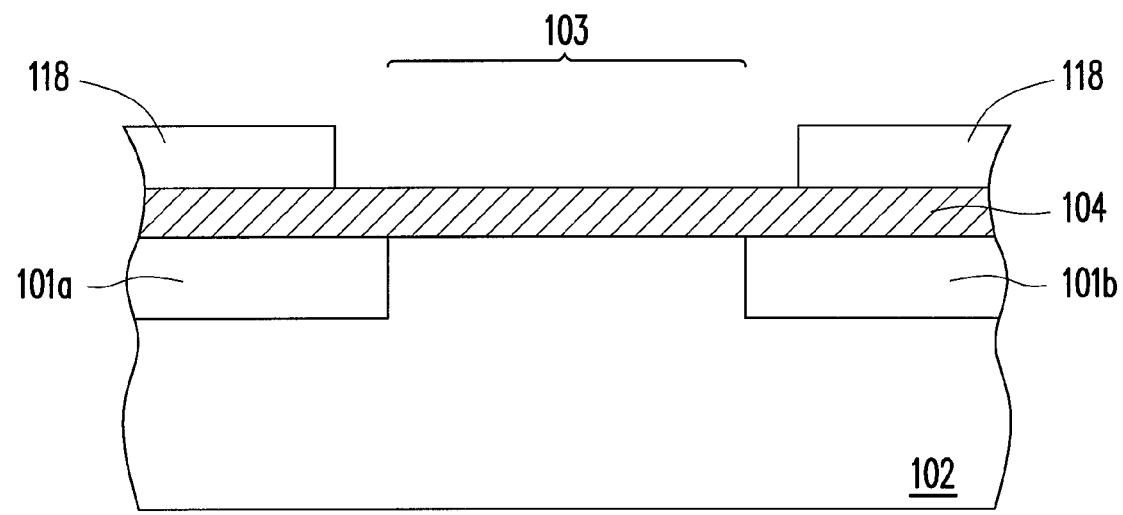
FIGS. 5A to 5D are cross-sectional views illustrating a method of fabricating a non-volatile memory taken along the line I-I' in FIGS. 4A to 4D.

Referring to FIGS. 4A and 5A, isolation structures 101a and 101b are formed in a substrate 102, so as to define an active area 103. The substrate 102 may be a semiconductor substrate such as a silicon substrate. The isolation structures 101a and 101b may be local oxidation of silicon (LOCOS) or shallow trench isolation (STI) structures and the forming method thereof includes performing a lithography process, an etching process, a selective thermal oxidation process, a selective chemical vapor deposition (CVD) process, and an selective chemical mechanical polishing (CMP) process. Thereafter, a blanket first conductive layer 104 and a patterned photoresist layer 118 are sequentially formed on the substrate 102. The blanketly formed first conductive layer 104 includes polysilicon, doped polysilicon, work function metal or combinations thereof, for example. The method of forming the first conductive layer 104 includes performing a chemical vapor deposition (CVD) process.

Figure 4B:
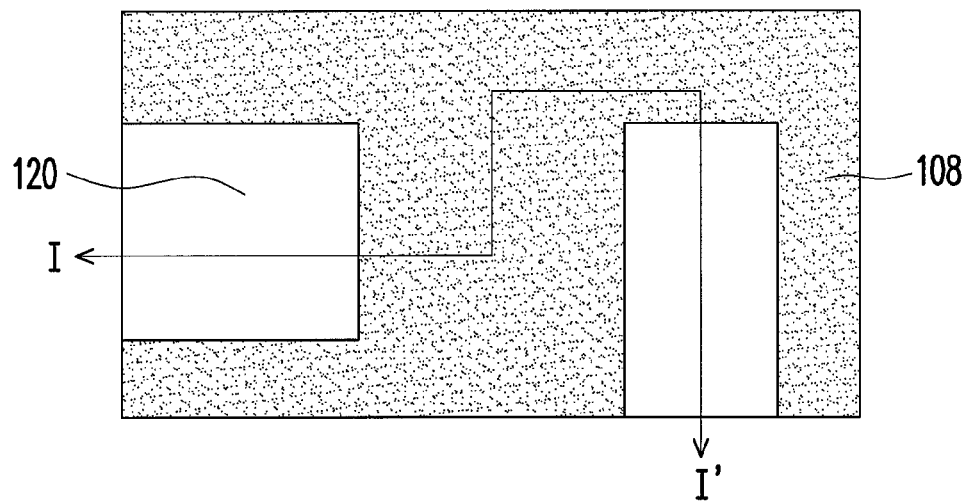
Figure 5B:
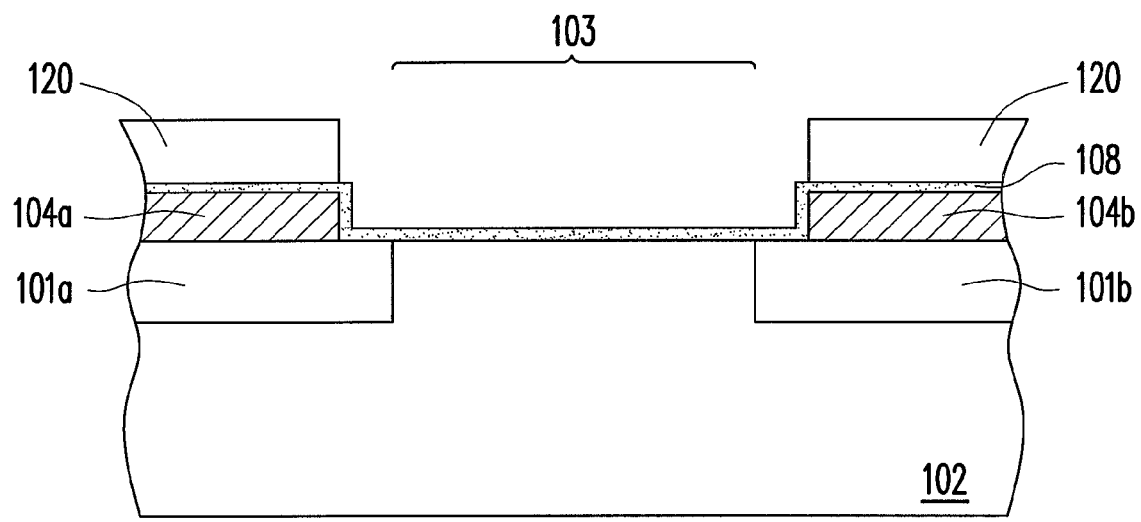

Referring to FIGS. 4B and 5B, a portion of the first conductive layer 104 is removed, using the patterned photoresist layer 118 as a mask, so as to respectively form first conductive layers 104a and 104b on the isolation structures 101a and 101b. Thereafter, the patterned photoresist layer 118 is removed. Afterwards, a blanket first dielectric layer 108 and a patterned photoresist layer 120 are sequentially formed on the substrate 102. The first dielectric layer 108 includes oxide, nitride, carbide, high k metal oxide or combinations thereof, for example. The method of forming the first dielectric layer 108 includes performing a thermal oxide process or a CVD process, for example. In an embodiment, the first dielectric layer 108 may be an ONO layer formed through a CVD process.

Figure 4C:
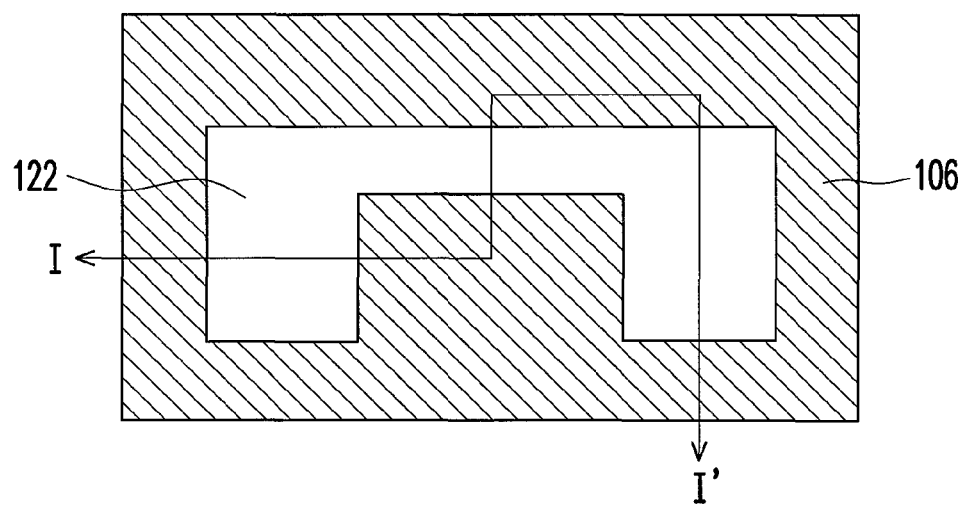
Figure 5C:
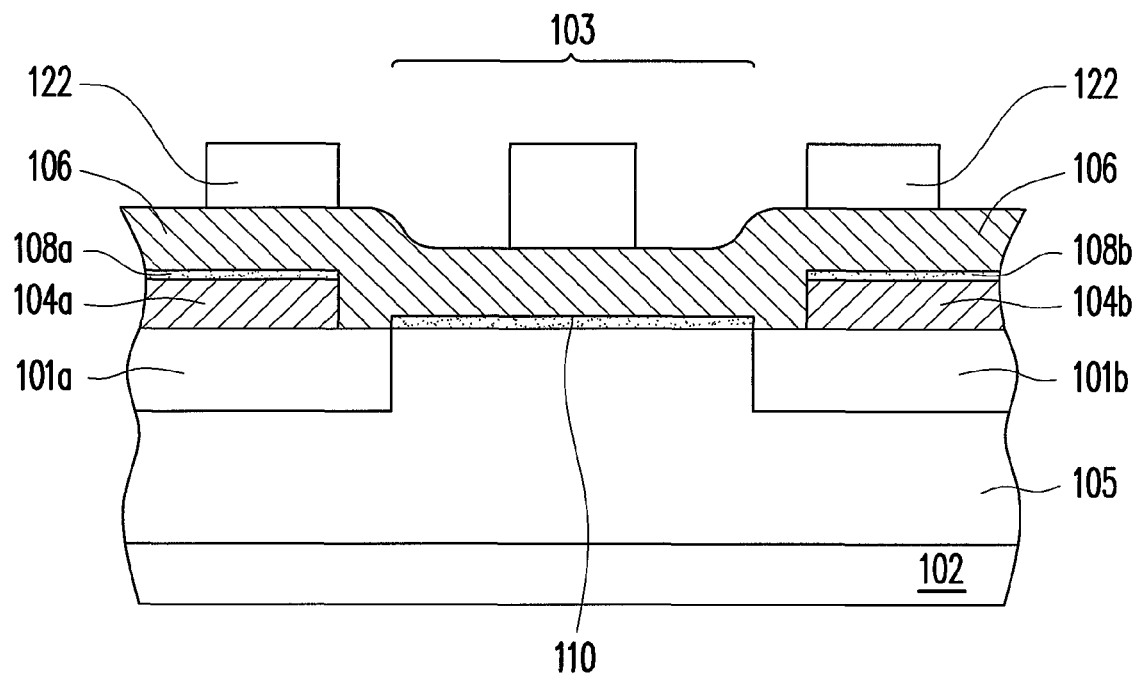

Referring to FIGS. 4C and 5C, a portion of the first dielectric layer 108 is removed, using the patterned photoresist layer 120 as a mask, so as to respectively form first dielectric layers 108a and 108b on the first conductive layers 104a and 104b. Thereafter, the patterned photoresist layer 120 is removed. Afterwards, a well 105 is formed in the substrate 102. The method of forming the well 105 includes performing a lithography process to cover the region not requiring implantation and then performing an ion implantation process to the region requiring implantation, for example. A second dielectric layer 110 is then formed on the substrate 102 in the active area 103. The second dielectric layer 110 includes oxide, nitride, metal oxide or combinations thereof, for example. The method of forming the second dielectric layer 110 includes performing a thermal oxide process or a CVD process, for example. In an embodiment, the second dielectric layer 110 may be a silicon oxide layer formed through a thermal oxide process. Further, a blanket second conductive layer 106 and a patterned photoresist layer 122 are sequentially formed on the substrate 102. The second conductive layer 106 includes polysilicon, doped polysilicon, work function metal or combinations thereof, for example. The method of forming the second conductive layer 106 includes performing a CVD process, for example.

Figure 4D:
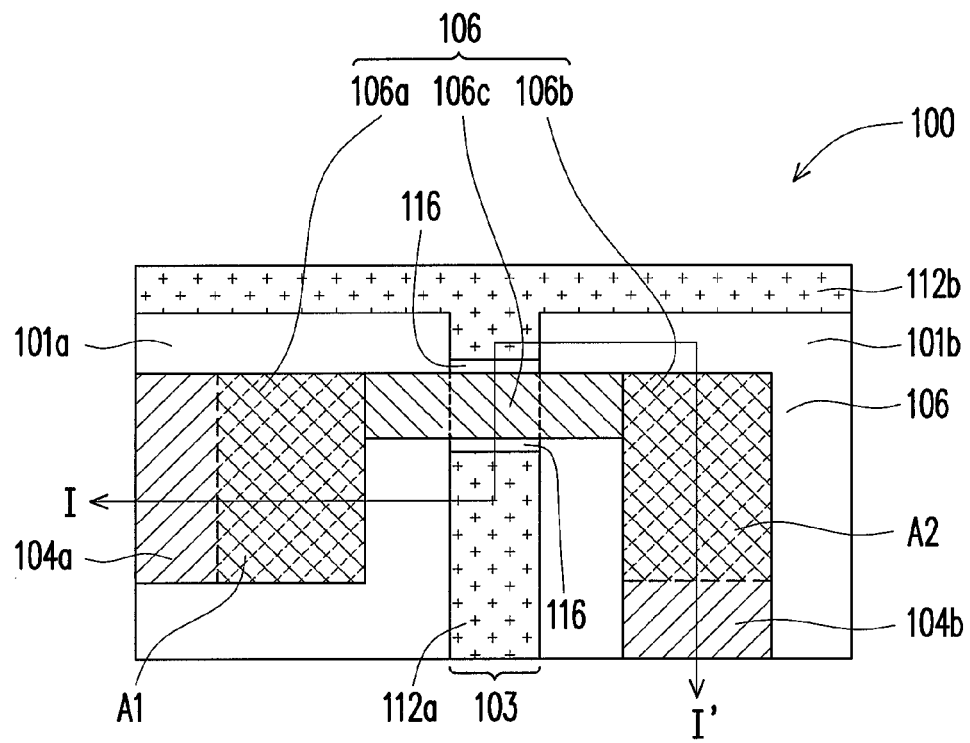
Figure 5D:
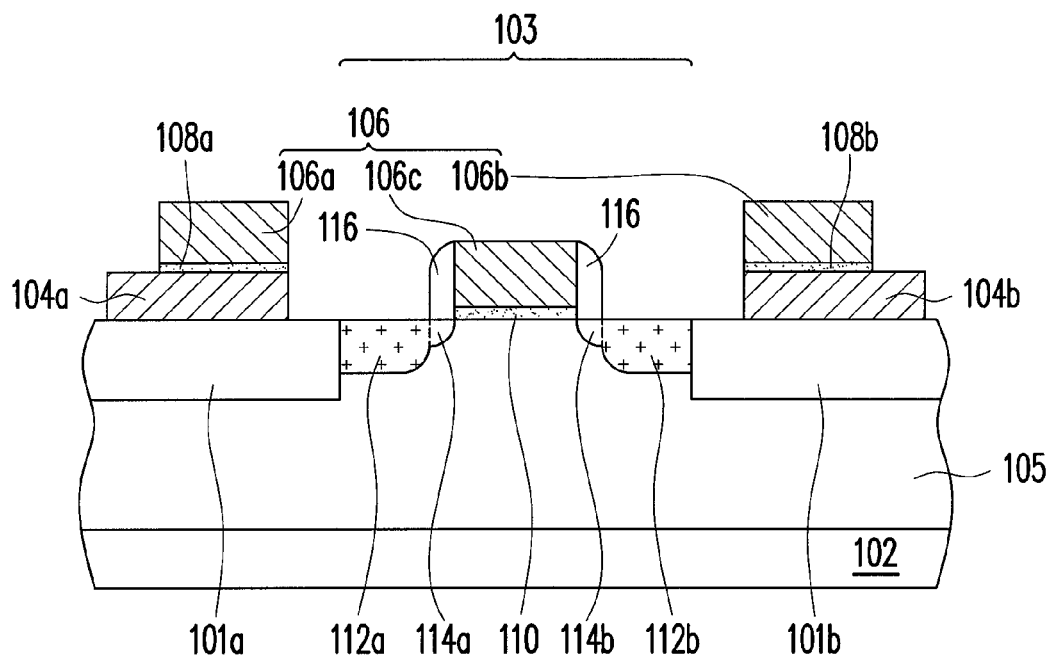

Referring to FIGS. 4D and 5D, a portion of the second conductive layer 106 is removed, using the patterned photoresist layer 122 as a mask, so as to form second conductive layers 106a, 106b and 106c. In details, the second conductive layers 106a and 106b are respectively formed on the first conductive layers 104a and 104b, and the second conductive layer 106c is formed on a portion of the substrate 102 in the active area 103. During the step of forming the second conductive layer 106a, 106b and 106c, a portion of the first dielectric layer 108a and 108b as well as a portion of the second dielectric layer 110 are also removed simultaneously. Thereafter, the patterned photoresist layer 122 is removed. An ion implantation process is then performed, using the second conductive layer 106c as a mask, so as to form lightly doped regions 114a and 114b in the substrate 102 beside the second conductive layer 106c. Further, a spacer 116 is formed on the sidewall of the second conductive layer 106c. The spacer 116 includes oxide, nitride, oxynitride or combinations thereof, for example. The method of forming the spacer 116 includes conformally forming a spacer material layer (not shown) on the substrate 102, and then removing a portion of the spacer material layer by performing an anisotropic etching process. Another ion implantation process is then performed, using the spacer as a mask, so as to form heavily doped regions 112a and 112b in the substrate 102 beside the spacer 116. The fabrication process of the non-volatile memory of the present invention is thus completed.

In summary, the non-volatile memory of the present invention has two control gates, so that the charge connection voltage ($V_{CC}$) can be reduced. The voltages of the two control gates can be the same or different upon the design requirement, so that the operation flexibility of the device is increased.

Further, the non-volatile memory of the present invention has the first conductive layers and first dielectric layers additionally formed on the isolation structures, so that the fabrication process thereof can be integrated with a common transistor process, and the peripheral circuit design thereof is simpler than that of the conventional single-poly non-volatile memory. Therefore, the design difficulty of the non-volatile memory of the present invention is not increased, and the application of the same is significantly enhanced.

Moreover, the programming and erasing operations of the non-volatile memory of the present invention are performed through FN tunneling, which requires less power consumption than the conventional method by injecting CHEs and CHHs.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A non-volatile memory, comprising:
   a substrate, having at least two isolation structures therein and an active region between the isolation structures;
   two control gates, respectively disposed on the isolation structures, wherein the two control gates are disposed within each one single memory cell;

a floating gate corresponding to the two control gates, the floating gate being disposed on the substrate and comprising three portions, wherein one of the three portions covers a portion of the active region and two of the three portions locate above and cover the two control gates respectively, an entire overlapped area of each of the two control gates and the floating gate is completely located on the corresponding one of the at least two isolation structures;

a first dielectric layer, disposed between each of the two control gates and the floating gate;

a second dielectric layer, disposed on the substrate, the second dielectric layer being contacted with and located between the substrate in the active region and the floating gate; and two heavily doped regions, respectively disposed in the substrate beside the floating gate.

2. The non-volatile memory of claim 1, wherein each of the two control gates comprises polysilicon, doped polysilicon, work function metal or combinations thereof.

3. The non-volatile memory of claim 1, wherein the floating gate comprises polysilicon, doped polysilicon, work function metal or combinations thereof.

4. The non-volatile memory of claim 1, wherein the first dielectric layer comprises oxide, nitride, carbide, high k metal oxide or combinations thereof.

5. The non-volatile memory of claim 1, wherein the second dielectric layer comprises oxide, nitride, metal oxide or combinations thereof.

6. The non-volatile memory of claim 1, further comprising a well disposed in the substrate.

7. The non-volatile memory of claim 1, further comprising two lightly doped regions, respectively disposed in the substrate, each of the two lightly doped regions being located between the floating gate and each heavily doped region.

8. The non-volatile memory of claim 1, further comprising a spacer disposed on a sidewall of the one of the three portions of the floating gate covering the portion of the active region.

9. The non-volatile memory of claim 1, wherein the overlapped area between one of the two control gates and the floating gate is the same as the overlapped area between the other of the two control gates and the floating gate.

10. The non-volatile memory of claim 1, wherein the first dielectric layer is a gate dielectric layer, and the second dielectric layer is a tunneling dielectric layer.

11. The non-volatile memory of claim 1, wherein a first voltage and a second voltage are applied to the two control gates respectively.

12. A non-volatile memory, comprising:
a substrate, having a first isolation structure and a second isolation structure therein and an active region between the first isolation structure and the second isolation structure;

a first control gate, disposed on the first isolation structure;

a second control gate, disposed on the second isolation structure, wherein the first control gate and the second control gate are disposed within each one single memory cell;

a floating gate comprising a first portion, a second portion and a third portion, the first portion being only disposed on the first control gate to cover the first control gate to form a first overlapped area of the first control gate and the floating gate, the second portion being only disposed on second control gate to cover the second control gate to form a second overlapped area of the second control gate and the floating gate, the third portion covering a portion of the active region, and the entire first overlapped area and the entire second overlapped area being respectively located on the first isolation structure and the second isolation structure;

a first dielectric layer, respectively disposed between the first control gate and the first portion and between the second gate and the second portion;

a second dielectric layer, disposed on the substrate, the second dielectric layer being contacted with and located between the substrate in the active region and the first portion of floating gate;

a first heavily doped region, disposed in the substrate beside the floating gate; and a second heavily doped region, disposed in the substrate beside the floating gate.

13. The non-volatile memory of claim 12, further comprising:
a first lightly doped region, disposed in the substrate and located between the first portion of the floating gate and the first heavily doped region; and a second lightly doped region, disposed in the substrate and located between the second portion of the floating gate and the second heavily doped region.

14. The non-volatile memory of claim 12, further comprising a spacer disposed on a sidewall of the third portion of the floating gate.

15. The non-volatile memory of claim 12, wherein then first overlapped area between the first control gate and the floating gate is the same as the second overlapped area between the second control gate and the floating gate.

16. The non-volatile memory of claim 12, wherein a first voltage and a second voltage are applied to the first control gate and the second control gate respectively.

* * * * *